US 6,704,209 B2

(12) United States Patent
Yamauchi et al.

(10) Patent No.: US 6,704,209 B2
(45) Date of Patent: Mar. 9, 2004

(54) AGGREGATE OF ELECTRONIC COMPONENTS AND MOUNTING METHOD THEREOF

(75) Inventors: Hiroshi Yamauchi, Katano (JP); Minoru Yamamoto, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 87 days.

(21) Appl. No.: 09/892,746

(22) Filed: Jun. 28, 2001

(65) Prior Publication Data

US 2002/0021561 A1 Feb. 21, 2002

(30) Foreign Application Priority Data

Jun. 30, 2000 (JP) .................................. 2000-199456

(51) Int. Cl.[7] .............................................. H05K 1/16
(52) U.S. Cl. ................................. 361/765; 361/766
(58) Field of Search .................... 361/765, 766, 361/793; 333/185

(56) References Cited

U.S. PATENT DOCUMENTS

| 3,775,725 | A | * | 11/1973 | Endo ........................... 338/262 |
| 5,420,553 | A | * | 5/1995 | Sakamoto et al. .......... 333/172 |
| 6,021,050 | A | * | 2/2000 | Ehman et al. ............... 361/793 |
| 6,061,241 | A | * | 5/2000 | Handforth et al. .......... 361/704 |
| 6,356,455 | B1 | * | 3/2002 | Carpenter .................... 361/793 |

FOREIGN PATENT DOCUMENTS

| JP | 6-251993 | 9/1994 |
| JP | 11-40459 | 2/1999 |

* cited by examiner

Primary Examiner—John B. Vigushin
(74) Attorney, Agent, or Firm—Wenderoth, Lind & Ponack, L.L.P.

(57) ABSTRACT

Three or more, or two or more types of electronic components are formed on one substrate, and these electronic components form an aggregated planar surface on a surface of the substrate.

2 Claims, 4 Drawing Sheets

(UNIT: mm)  MOUNTING AREA 7.56mm²

(UNIT: mm)  MOUNTING AREA 2.86mm²

AGGREGATE OF ELECTRONIC COMPONENTS AND MOUNTING METHOD THEREOF

BACKGROUND OF THE INVENTION

The present invention relates to an aggregate (cluster) of electronic components in which electronic components including an element and an electronic component are aggregated in a predetermined number and a mounting method thereof, and a mobile device comprising the aggregate of electronic components.

Recently, mobile devices represented by a telephone are on the way toward a reduction in weight and in size. Accordingly, the electronic circuit substrate incorporated in the mobile device is getting denser in the mounting of the electronic components while the electronic components used therein are also getting finer.

In order to mount the electronic components on the circuit substrate, gaps are required between the electronic components without fail. Since these gaps become extremely small as a result of said increase in density, there is a limit in the adjacent gaps in individually mounting even electronic components reduced in size in any way. Furthermore, there are various differences among the electronic components not only in size but also in height. In the case of correcting a mounting error which occurs easily as smaller adjacent gaps, when an electronic component is mounted again around higher electronic components than it, tools such as suction nozzle or the like for holding and handling electronic components are likely to interfere with the higher electronic components, which makes the work difficult and long or causes work failure or work malfunction, so that the electronic circuit substrate in process may become defective.

Furthermore, even when the electronic components are reduced to any small size, the number of electronic components to be mounted for manufacturing electronic circuit substrate remains the same, so that productivity is not improved. With greater difficulty in the mounting of the electronic components, the productivity and yield are lowered on the contrary.

On the other hand, Japanese Unexamined Patent Publication No. 06-251993 (1) and Japanese Unexamined Patent Publication No. 11-40459 (2) disclose technologies for dealing with the issue described above. As shown in FIG. 9, the technology described in the above publication (1) is such that each of flat plate-like chip bodies 100a forming elements with different electric functions such as a capacitor and/or a resistor, or elements with the same type of function are connected or joined in a row via an organic adhesive 100c which can disappear at the time of solder joining and inorganic adhesive 100d insolvent or undissolved at a solder joining temperature, allowing the sides with no outer electrode 100b formed to be faced each other. The technology described in the publication (2) is such that each terminal electrode of chip electronic components, adjacent to each other when the sides of the chip electronic components in rectangular parallelepiped configuration are allowed to adhere to each other, is provided on each end portion of the chip electronic components with the predetermined interval, and a plurality of the chip electronic components are allowed to adhere to each other at the side surfaces with adhesive to form one row, maintained integrally.

According to the technology described above, since a plurality of chip electronic components are integrally handled and mounted in the number of the electronic components connected in a row, so that the difficulty in mounting of the electronic components resulting from the miniaturizations can be avoided. At the same time, the required times of the mounting work for the required number of the components is decreased, so that the productivity and the yield can be improved.

However, when the electronic components individually formed are respectively connected to each other, like the aggregate of electronic components described in the publications (1) and (2), work to connect a plurality of electronic components is required in addition to the manufacture of individual electronic components, and the connection work becomes more difficult with the miniaturization of the electronic components. It is also necessary to consider at least that the mounting surfaces for the individual electronic components form a planar surface to connect the individual electronic components. Such connection of the components is favorable for the mounting thereof, but unfavorable for the manufacture of the components, and the cost of components comes high.

In the aggregate of electronic components described in the publications (1) and (2), only sides with no electrodes can be connected to each other, so that a row is inevitably formed as described above, where an arrangement of aggregated electronic components and an arrangement at the time of mounting the aggregate of electronic components on the circuit substrate have a small degree of freedom, which is inconvenient. Thus, in some cases, mounting in a high density cannot be provided.

Even if the aggregate of electronic components as described in the publications (1) and (2) can be mounted in a high density, all the individual electronic components themselves forming the aggregate of electronic components are mounted facing the circuit substrate, so that the mounting density of individual electronic components cannot be improved.

An object of the present invention is to provide an aggregate of electronic components favorable for the improvement of the mounting work and the mounting density and a mounting method thereof, and a mobile device by the method.

SUMMARY OF THE INVENTION

In order to attain the above object, an aggregate of electronic components according to the present invention is characterized in that three or more electronic components including an element and an electronic component are formed on one substrate, and these electronic components form an aggregated planar surface on the surface of the substrate. That is, there is provided an aggregate of electronic components comprising:

one substrate; and
three or more electronic components including an element and an electronic component, formed on the one substrate, forming an aggregated planar surface on a surface of the substrate.

In such a structure, since the electronic components including an element and an electronic component are formed on one substrate, there is no difficulty in the handling and arrangement works due to a small size of individual electronic components, as seen in the case that finished electronic components are individually handled and mounted, or connected, so that three or more electronic components are arranged up to the limit of electric characteristic such as insulation in a high density in various patterns considering the type, the configuration, and the size, and the aggregate can be manufactured at cheaper cost. At the same time, each of the arranged electronic components forms an aggregated planar surface on the surface of the substrate, and the whole of the substrate and the electronic components can be formed in a desired planar configuration and size, easily having the mounting surface of one planar surface in the form handled in the same way as normal chip electronic components. Consequently, handling and mounting the electronic components become easy and the lowering of the yield due to a mounting error can be settled, thereby, along with a high degree of freedom in the arrangement, the mounting of the electronic components in high density is facilitated to improve the mounting density as a whole.

Furthermore, depending on the combinations of the heights of the electronic components and the thickness of the substrate and the thickness of the position of individual electronic components on the substrate, the height of the whole of the substrate and the electronic components is uniformed with respect to the different types, avoiding the deterioration in the work efficiency before and after the mounting of the electronic components to provide convenience in the correction of the mounting, while an aggregated planar surface is formed, even in the case of a combination in which electronic components on the substrate have different heights, to heighten freedom in the combination of the types of electronic components formed on one substrate.

The aggregate of electronic components according to the present invention is also characterized in that two or more types of electronic components including an element and an electronic component are formed on one substrate, and these electronic components form an aggregated planar surface at a surface of the substrate. That is, there is provided an aggregate of electronic components comprising:

one substrate; and two or more types of electronic components including an element and an electronic component, formed on the one substrate, and forming an aggregated planar surface on a surface of the substrate.

In such a structure, since the electronic components including an element and an electronic component are formed on one substrate, there is no difficulty in the handling and arrangement works due to a small size of individual electronic components and difference in types, as seen in the case that finished electronic components are individually handled and mounted, or connected, so that two or more types of electronic components are arranged up to the limit of electric characteristic such as insulation in a high density in various patterns considering the type, the configuration, and the size, and the aggregate can be manufactured at cheaper cost. At the same time, each of the arranged electronic components forms an aggregated planar surface on the surface of the substrate, and the whole of the substrate and the electronic components can be formed in a desired planar configuration and size, easily having the mounting surface of one planar surface in the form handled in the same way as normal chip electronic components. Consequently, handling and mounting the electronic components become easy and the lowering of the yield due to a mounting error can be settled, thereby, along with a high degree of freedom in the arrangement, the mounting of the electronic components in high density is facilitated to improve the mounting density as a whole.

Furthermore, depending on the combinations of the height of the electronic components and the thickness of the substrate and the thickness of the position of individual electronic components on the substrate, the height of the whole of the substrate and electronic components is uniformed with respect to the different types, avoiding the deterioration in the work efficiency before and after the mounting of the electronic components to provide convenience in the correction of the mounting, while an aggregated planar surface is formed, even in the case of a combination in which electronic components on the substrate have different heights, to heighten freedom in the combination of the types of electronic components formed on one substrate.

In each of the above aggregates of electronic components, furthermore, each of the electronic components is formed on the upper surface of the substrate, and electrodes corresponding thereto can be formed on the upper surface or/and the side surface of the substrate so as to be connected to the other components on the upper surface side of the substrate, that is, there is provided an aggregate of electronic components according to the first or second aspect, wherein each of said electronic components is formed on an upper surface of the substrate, and electrodes corresponding thereto are formed on the upper surface and a side surface of the substrate so as to be connected with other element or component on an upper surface side of the substrate, so that the aggregate can be mounted on the mounting object such that each of the electrodes of the electronic components is allowed to face the mounting object on the same upper surface side of the substrate as the electronic components are formed on, to face and be connected to the connecting objects on the mounting object. Accordingly, the electrode structure can be made short and simple, and the electronic components are located between the substrate comprising the electronic components and the mounting object mounting the substrate to be protected from external force.

Then, a mounting method of the electronic components according to the present invention for mounting such electronic components is characterized in that a substrate, wherein three or more, or two or more types of electronic components including an element and an electronic component are formed on the upper surface, and electrodes corresponding thereto are formed at least on the upper surface out of the upper surface and the side surface so as to be connected to the other element or components on said upper surface, is reversed in such a manner that the upper surface is directed downward and mounted on the mounting object to connect the electrodes of the substrate to the side of the mounting object. That is, there is provided a method for mounting an aggregate of electronic components comprising:

reversing a substrate, comprising three or more, or two or more types of electronic components including an element and an electronic component on an upper surface thereof, and electrodes corresponding thereto at least on the upper surface out of the upper surface and a side surface thereof so as to be connected to other element or component on said upper surface, in such a manner that the upper surface is directed downward; and thereafter mounting the substrate on a mounting object to connect the electrodes of the substrate to a side of the mounting object.

An aggregate of electronic components according to the present invention is characterized in that three or more, or two or more types of the electronic components including an element and an electronic component are formed on a substrate, their electrodes are formed at least on the lower surface out of the lower surface and the side surface of the substrate so as to be connected to the other element or components on the lower surface side of the substrate, and the electrodes provided on the lower surface of the substrate are connected to the electronic components formed on the upper surface of the substrate via the side surface of the substrate and/or a through hole. That is, there is provided an aggregate of electronic components comprising;

a substrate; and three or more, or two or more types of electronic components including an element and an electronic component and formed on the substrate, with electrodes corresponding thereto being formed at least on a lower surface of the lower surface and a side surface of the substrate so as to be connected to other element or component on the lower surface thereof, and with the electrodes provided on the lower surface of the substrate being connected to electronic components formed on an upper surface of the substrate via the side surface of the substrate and/or a through hole.

In such a structure, the electrodes are provided on the substrate so as to be connected to the other element or components on the lower surface side of the substrate. Consequently, the electrodes can be connected to not only the electronic components formed on the lower surface but also the electronic components formed on the upper surface via the side surface of the substrate and/or through hole without fail. As a result, the electronic components formed on the upper surface of the substrate or the electronic components formed on the upper and the lower surfaces of the substrate can be connected to the mounting object with ease when the substrate is mounted on the mounting object on the lower surface side, and thereby, in a case that the electronic components are formed on the both of the upper and the lower surfaces of the substrate, two electronic components are overlapped and mounted on the same planar surface space to increase the mounting density two times.

Along with this, the aggregate of electronic components according to the present invention is also characterized in that a plurality of electronic components including an element and an electronic component are distributed to the upper surface and the lower surface of one substrate, and the electrodes of the electronic components formed on the upper surface are formed on the side surface of the substrate while the electrodes of the electronic components formed on the lower surface are formed on the lower surface of the substrate, where, in the case that the electronic components are formed on the both of the upper and the lower surfaces without providing a through hole on the substrate, the side of the substrate is effectively used so that the electronic components can be connected to the mounting object without fail in the same manner as said other characteristics.

The aggregate of the electronic components of the present invention is also characterized in that a plurality of the aggregates of electronic components including an element and an electronic component are distributed to the upper and the lower surfaces of one substrate to form thereon, and the electrode of the electronic components formed on the upper surface are formed on the side surface of the substrate while the electrode of the electronic components formed on the lower surface are formed on the side surface of the substrate with no electrode of the electronic components formed on the upper surface. That is, there is provided an aggregate of electronic components comprising:

one substrate; and electronic components including an element and an electronic component and distributed to an upper surface and a lower surface of the one substrate, with the electrodes of the electronic component formed on the upper surface being formed on a side of the substrate and with electrodes of the electronic component formed on the lower surface being formed on a side surface of the substrate having no electrode of the electronic component formed on the upper surface.

In such a structure, while the electronic components are formed on the both of the upper and the lower surfaces of the substrate to double the mounting density, the connection of the electronic components on the upper and the lower surfaces of the substrate with the mounting object is ensured only with the electrodes on the side surface of the substrate, so that the portion of the electrodes formed on the upper and the lower surfaces of the substrate is reduced. As a result, the required area of the substrate can be reduced and the number of the formation of the electronic components on the upper and the lower surfaces of the substrate can be increased, which can realize further improvement in the mounting density of the electronic components.

In case of forming the electronic components on the substrate, resistors can be formed on the both of the upper and the lower surfaces, and a resistor can be formed on the upper surface or/and the lower surface of the substrate inside of which a capacitor or an inductor is formed. Combinations of the number and the type of the electronic components formed on one substrate allow the aggregate of electronic components to correspond to the target connecting circuit with various characteristics, thereby the target connecting circuit can be simplified and the size of the electronic circuit substrate mounting the electronic components on the circuit substrate can be reduced.

The aggregate of electronic components according to the present invention is also characterized in that two or more resistors are formed on one substrate, and these resistors are set in advance to predetermined resistance values different from each other by trimming.

In such a structure, since two or more resistors formed on the substrate are adjusted in advance so as to have a resistor value required on the target connecting circuit by trimming, adjustment by the pull-out of the wiring on the side of the target connecting circuit is not required, thereby the productivity can be improved and the size of the electronic circuit substrate mounting the electronic components on the circuit substrate can be reduced.

One feature of a mobile device of the present invention is that any of the above aggregates of electronic components is mounted on a circuit substrate with a wiring pattern, so that the electrodes of the substrate and the wiring pattern of the circuit substrate are connected.

In such a structure, a small-size, light-weight and cheap mobile device, which has an electronic circuit substrate manufactured by using any feature of each of the above aggregates of electronic components, is obtained.

Further feature and operation of the present invention will be made clear from the detailed description and the description of the drawings below. Each of the features of the present invention can be used solely or in various combinations as much as possible.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
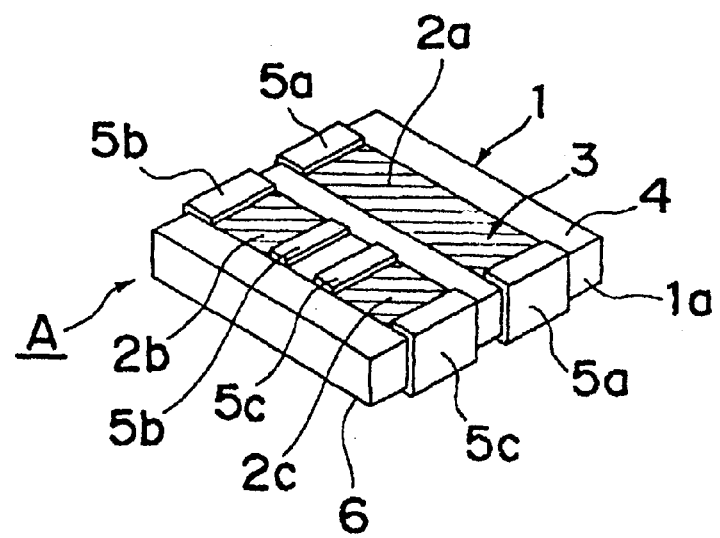
FIG. 1 is a perspective view showing an example of an aggregate of electronic components according to an embodiment of the present invention.

Before the description of the present invention proceeds, it is to be noted that like parts are designated by like reference numerals throughout the accompanying drawings.

Hereinafter, an aggregate of electronic components, a mounting method thereof, and a mobile device by the method, according to an embodiment of the present invention, will be explained in detail referring to FIGS. 1 through 8. The above explanation intends to facilitate the understanding of the present invention. Incidentally, the embodiment shown hereinbelow is an example where an electronic circuit substrate is manufactured by mounting or reflow processing following temporarily mounting of the aggregate of electronic components on a circuit substrate with a wiring pattern. The embodiments are a specific example, however, and are not intended to restrict the technological scope of the present invention. The present invention is effective even in the case where an electronic device other than the substrate is an object to be mounted.

Figure 2:
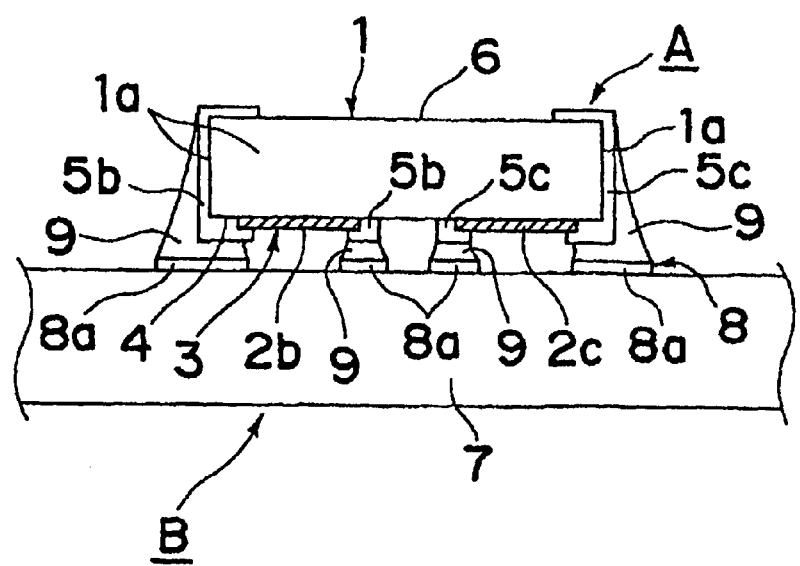
FIG. 2 is a side view in the case where the aggregate of electronic components of FIG. 1 is mounted on a circuit substrate to provide an electronic circuit substrate.

In one example shown in FIGS. 1 and 2, three or more electronic components 2a through 2c including an element and an electronic component or two or more types of electronic components are formed on one substrate 1. These electronic components 2a through 2c are discontinuous on an upper surface 4 which is a surface of the substrate 1, but forms an aggregated planar surface 3 which forms a surface of one component surface. Hence, the different types of electronic components mean electronic components manufactured by different companies, having different sizes, heights, or electric characteristics such as capacitor, inductance, or resister values.

The substrate 1 is formed of an insulation material such as ceramic or the like. Although the electronic components 2a through 2c differ depending on the type, capacitors, inductors, resistors, or the like can be easily formed by printing, drawing, evaporating, plating or the like. In summary, a method suitable for the type of the electronic components 2a through 2c to be formed may be adopted. The electronic components 2a through 2c to be formed may include all elements and electronic components which can be directly formed on the substrate 1.

In this manner, since the electronic components 2a through 2c are formed on one substrate 1, there is no difficulty in the handling and arrangement works due to the small size of individual electronic components 2a through 2c as seen in the case that finished electronic components 2a through 2c are individually handled, mounted, and connected, so that three or more electronic components 2a through 2c are arranged up to the limit of electric characteristic such as insulation in a high density in various patterns including the cases shown in FIGS. 1 and 2, considering the type, the configuration and the size and the aggregates can be manufactured at cheaper cost.

Besides, each of the there or more electronic components 2a through 2c or two types or more electronic components formed on the substrate 1 form the aggregated planar surface 3 on the surface of the substrate 1, so that the whole of the substrate 1 and the electronic components 2a through 2c are formed in a desired planar configuration and size, easily having a mounting surface of one planar surface, by using said aggregate planar surface or the lower surface of the substrate 1, in a form handled in the same manner as normal chip electronic components. As a result, the electronic components can be easily handled and mounted to settle the lowering of the yield resulting from the mounting error, thereby, along with a high degree of freedom in the arrangement, the mounting of the electronic components in a high density is facilitated to improve the mounting density as a whole.

Furthermore, depending on the combinations of the heights of electronic components 2a through 2c ... and the thickness of the substrate 1 and the thickness of the mounting position of individual electronic components on the substrate 1, the whole height of the substrate 1 and the electronic components 2a through 2c is uniformed with respect to the different types, avoiding the deterioration in the work efficiency before and after the mounting of the electronic components, and facilitating the remounting. Even in the case of the combination of different heights of the electronic components on the substrate, the aggregated planar surface can be provided to increase a degree of freedom in the combination of the types of electronic components formed on one substrate.

In examples shown in FIGS. 1 and 2, the upper surface 4 on which the electronic components 2a through 2c are formed forms a mounting surface, so that each pair of the electrodes 5a through 5c in each of electronic components 2a through 2c can be connected to other element or components on the side of the upper surface 4 on which the electronic components 2a through 2c are formed. Specifically, each of the electrodes 5a through 5c is provided to be positioned on the upper surface 4 of the substrate 1. Each of the electrodes 5a through 5c extending to the side surface 1a of the substrate 1 is provided so as to attain a part of the periphery of the lower surface 6 of the substrate 1 from the side surface 1a of the substrate 1.

Then, in order to mount such aggregate A of electronic components on a circuit substrate 7, a mounting object to be mounted, the substrate 1, where three or more, or two or more types of the electronic components 2a through 2c are formed on the upper surface 4, and the electrodes 5a through 5c corresponding thereto are formed so as to be connected to the other element or components, is reversed from the state shown in FIG. 1 to the state shown in FIG. 2 so that the upper surface 4 is directed downward to be mounted on the circuit substrate 7, so that the electrodes 5a through 5c of the substrate 1 are connected to lands 8a etc. of a wiring pattern 8 formed on the circuit substrate 7. This connection may be provided with solder 9 as shown in FIG. 2, for example. In this case, the electrodes extended to the side surface of the substrate 1 out of the electrodes 5a through 5c can be heightened in terms of mounting strength and connection efficiency by using the extended potion to the side surface as a wet surface with solder 9.

In the above-described mounting as shown in FIG. 2, there is an advantage in that the aggregate A of the electronic components 2a through 2c can be mounted on the circuit substrate 7 so that the electrodes 5a through 5c of each of the electronic components 2a through 2c are allowed to be faced the circuit substrate 7 on the side of the same upper surface 4 as the electronic components 2a through 2c of the substrate 1 are formed on, and located opposite and connected to the lands 8a of the wiring pattern 8, a connection object. As a result, the structure of the electrodes 5a through 5c is shortened and simplified, and the electronic components 2a through 2c are located between the substrate 1 on which the electronic components 2a through 2c are formed and the circuit substrate 7 mounting the substrate 1 to be protected from external force. At this time, a flat lower surface 6 of the substrate 1 is preferable as a suction surface to be sucked and held with the suction nozzle at the time of mounting the aggregate A of the electronic components.

Figure 3:
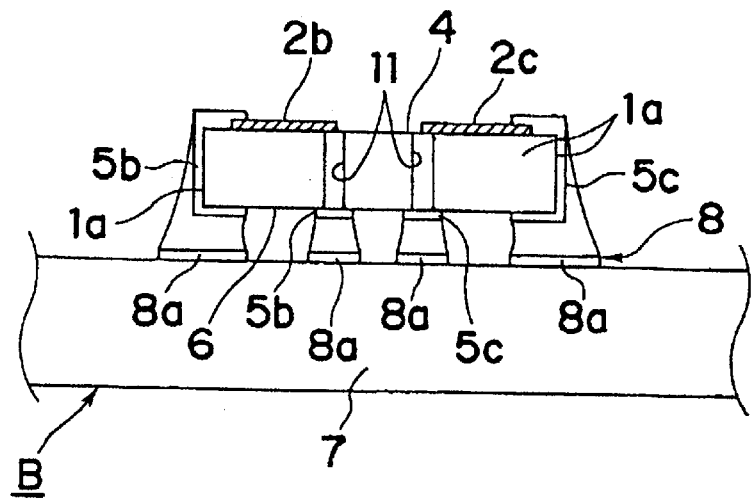
FIG. 3 is a side view showing another example of an aggregate of electronic components according to the embodiment of the present invention.

In an example shown in FIG. 3, three or more, or two or more types of electronic components 2a through 2c are formed on the substrate 1, and the electrodes 5a through 5c thereof are formed at least on the lower surface 6 out of the lower surface 6 and the side surface 1a of the substrate 1 so as to be connected to the other element or components on the side of the lower surface 6 of the substrate 1. The electrodes provided on the lower surface 6 of the substrate 1 out of the electrodes 5a through 5c are connected to the electronic components formed on the upper surface 4 of the substrate 1 out of the electronic components 2a through 2c via the side surface 1a of the substrate 1 or/and a through hole 11. Furthermore, specifically, as shown in the drawing, electronic components are not formed on the lower surface 6 of the substrate 1. However, it can be easily understood that the electronic components can also be connected to the lands 8a of the wiring pattern 8 of the circuit substrate 7 on the lower surface of the substrate 1 by using the electrodes 5a through 5c on the lower surface of the substrate 1 on which electronic components are formed.

In this manner, with the electrodes 5a through 5c which can be connected to the other element or components on the side of the lower surface 6 of the substrate 1, the electrodes 5a through 5c are connected not only to the electronic components formed on the lower surface 6 of the substrate but also to the electronic components 2a through 2c formed on the upper surface 4 without fail via the side surface 1a of the substrate 1 or/and the through hole 11, so that in order to mount the substrate 1 onto the circuit substrate 7 on the side of the side surface 6 thereof, electronic components 2a through 2c formed on the upper surface 4 of the substrate 1 or the electronic components 2a through 2c formed on the both of the upper and the lower surfaces of the substrate 1 can be connected to the circuit substrate 7 without difficulty. Accordingly, the formation of electronic components 2a through 2c on the both upper and lower surfaces of the substrate 1 leads to the overlapped mounting of the two sets of the electronic components 2a through 2c in the same planar space to increase the mounting density.

Figure 4:
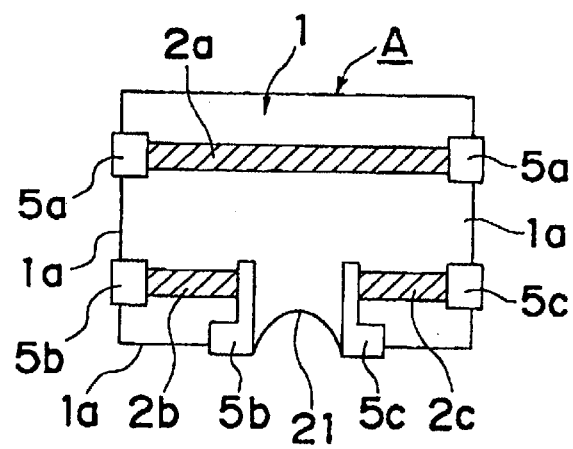
FIG. 4 is a plan view showing a variation of the aggregate of electronic components of FIGS. 1 and 2.

When any of the electrodes 5a through 5c is provided on the side surface 1a of the substrate 1, as described above, a notch 21 is provided between the two electrodes 5b and 5c adjacent to each other on the side surface 1a in the example of FIG. 4. With such a structure, even in the case where an error occurs in the position and the width at the time of the formation of the electrodes 5b and 5c formed adjacent to each other, the presence of the notch 21 easily prevents the mutual contact and short-circuit of the electrodes to improve the yield.

Figure 5:
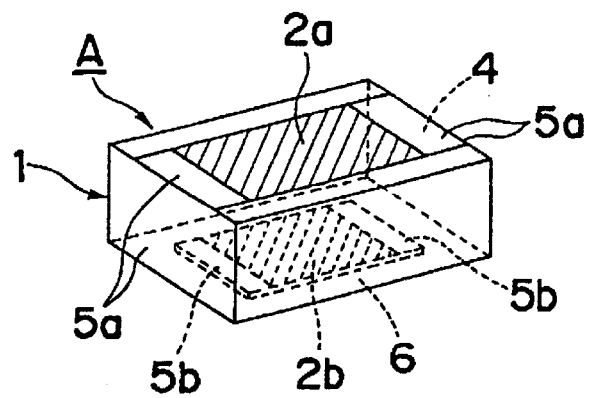
FIG. 5 is a perspective view showing another example of the aggregate of electronic components according to the embodiment of the present invention.
Figure 6:
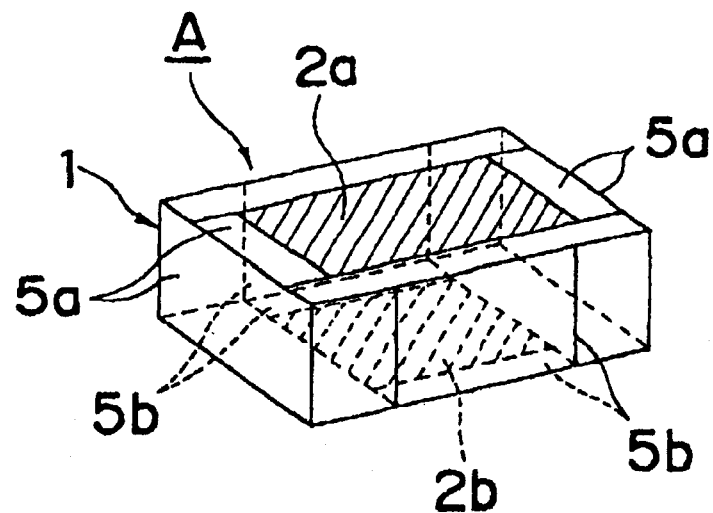
FIG. 6 is a perspective view showing still another embodiment of the aggregate of electronic components according to the embodiment of the present invention.

In each of the examples shown in FIGS. 5 and 6, electronic components 2a through 2c are distributed on the upper surface 4 and the lower surface 6 of one substrate 1. In the example shown in FIG. 5, the electrodes 5a of the electronic components 2a formed on the upper surface 4 are formed on the side surface 1a of the substrate 1. The electrodes 5b of the electronic components 2b formed on the lower surface 6 are formed on the lower surface 6 of the substrate 1. Furthermore, in the example shown in FIG. 6, the electrodes 5a of the electronic components 2a formed on the upper surface 4 of the substrate 1 are formed on the side surface 1a of the substrate 1, while the electrodes 5b of the electronic components 2b formed on the lower surface 6 of the substrate 1 are formed on the side surface 1a of the substrate 1 on which the electrodes 5b of the electronic components 2a on the upper surface 4 of are not provided.

With such a procedure, in the case where electronic components 2a, 2b are formed on the upper and the lower surfaces 4 and 6 to increase the mounting density of the components, the side surface of the substrate is effectively used to ensure the connection with the circuit substrate 7, and the provision of the through hole in the substrate 1 can be avoided, thereby it is possible to heighten the arrangement efficiency of the electronic components 2a, 2b on the upper and the lower surfaces 4 and 6 of the substrate 1. At the same time, the portion of the electrodes formed on the upper surface 4 and the lower surface 6 of the substrate 1 is reduced to decrease the required area of the substrate 1, or the number of the formed electronic components 2a, 2b on the upper surface 4 and the lower surface 6 of the substrate 1 can be increased, thereby it is possible to further improve the mounting density of the electronic components 2a, 2b.

Figure 7:
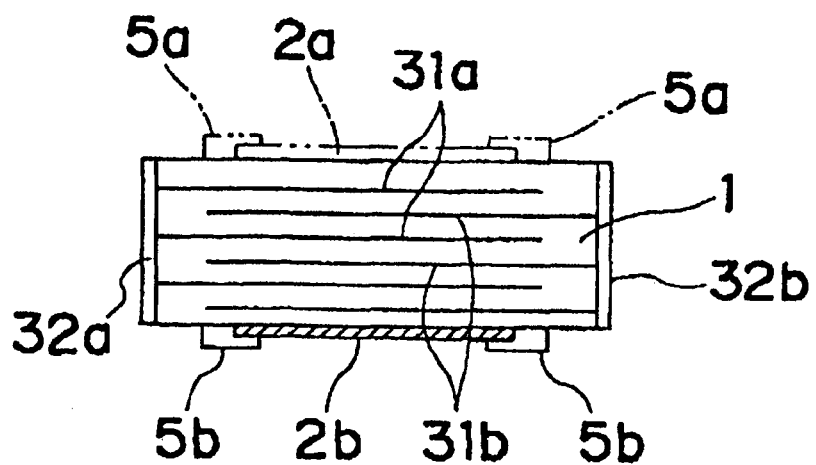
FIG. 7 is a side view showing still another example of the aggregate of electronic components according to the embodiment of the present invention.

Incidentally, the illustrated electronic components 2a, 2b are all resistors. As seen in the example of FIG. 7, the electronic components 2a and 2b are formed which are resistors can be formed on the upper surface 4 or/and the lower surface 6 of the substrate 1 inside of which capacitors 31a and 31b or an inductor are formed. Including the case where the electronic components 2a, 2b which are resistors are formed on the both of the upper and lower surfaces 4 and 6 of the substrate 1 of FIG. 6, the combinations of the number and types of the electronic components 2a, 2b formed on one substrate 1 allows the aggregate to correspond to the target connecting circuit with various characteristics. Consequently, simplification of the target connecting circuit and size reduction of the electronic circuit substrate mounting the electronic components 2a, 2b, on the circuit substrate can be attempted. Reference numerals 32a and 32b denote the electrodes of the capacitors 31a and 31b.

Figure 8A:
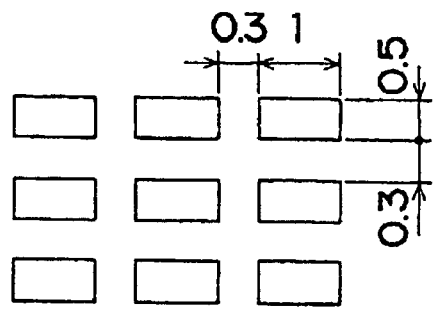
FIGS. 8A and 8B are views showing a comparison between the prior art in which the electronic components are individually mounted and the embodiment of the present invention in which the electronic components are mounted in an aggregate of electronic components with respect to the mounting conditions and the mounting result, FIG. 8A showing a case of the prior art and FIG. 8B showing the case of the embodiment of the present invention.
Figure 8B:
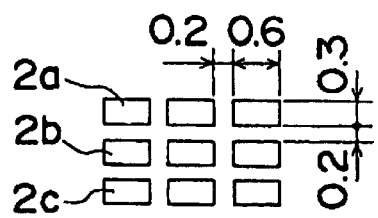
Figure 9:
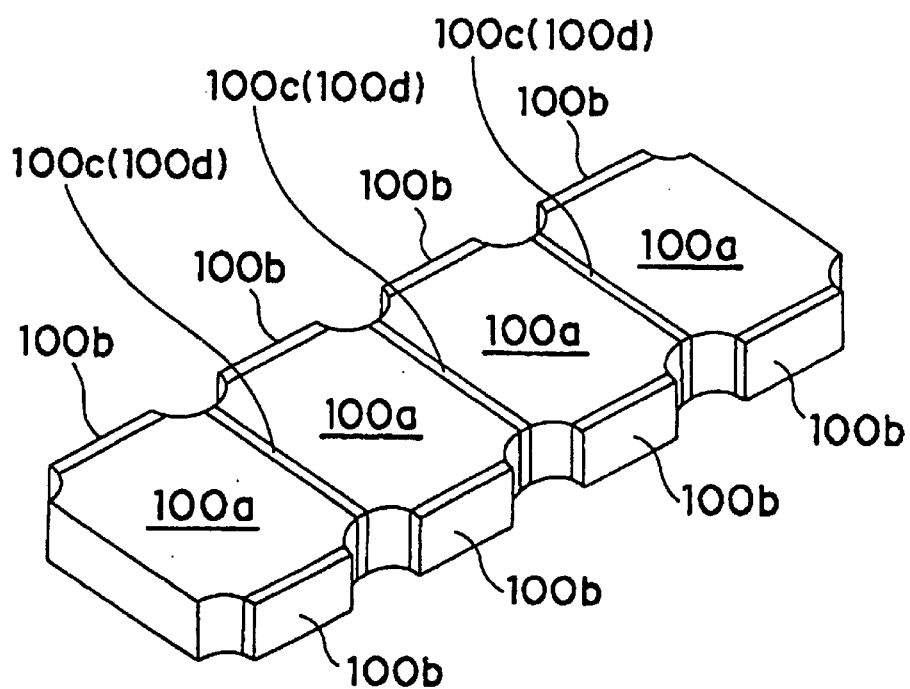
FIG. 9 is a perspective view showing a conventional aggregate of electronic components.

The aggregates A of electronic components in which a plurality of the electronic components 2a and 2b are formed on one substrate 1, described above, largely decreases at a ratio at which the mounting cycle times (tacts) of the electronic components 2a, 2b are divided by the number of the electronic components 2a, 2b . . . to be formed on the substrate 1. Consequently, the minimum component size and the mounting interval required in the case of using the substrate 1 become smaller as shown in FIG. 8B, compared with the minimum component size and the mounting interval required in the case where the electronic components 2a, 2b are individually handled and mounted as shown in FIG. 8A, and the mounting area decreases from 7.56 mm² to 2.86 mm².

However, in the mounting of the electronic components 2a, 2b using the substrate 1, there is a case where the universality is damaged in a relation between the positions in the wiring pattern 8 on the circuit substrate 7 as shown in FIGS. 2 and 3 and the positions on which the electronic components 2a, 2b are mounted. As a consequence, in the case where the resistor is formed on the substrate 1, the resistor formed to have a resistance value in accordance with the electric circuit formed by the wiring pattern 8 of the circuit substrate 7 is adjusted in advance by using a laser or the like, which prevent a redundant pull-out of the wiring on the circuit substrate 7 for the adjustment of resistance, thereby it is possible to improve the productivity of the electronic circuit substrate and the reduction in size. Then, a mobile device using the electronic circuit substrate B as shown in FIGS. 2 and 3 formed by mounting the above aggregate A of electronic components on the circuit substrate 7 is remarkably decreased in weight and in size, and the cost thereof is decreased.

According to the aggregate of electronic components of the present invention, since electronic components including an element and an electronic component are formed on one substrate, there is no difficulty in the handling work and the arrangement work due to small sizes of individual electronic components, as seen in the case of individually handling and mounting, or connecting finished electronic components. Three or more electronic components are arranged in various patterns and in a high density up to the limit of the electric characteristic such as insulation while considering the type, the configuration, and the size, and the aggregate can be manufactured at cheaper cost. At the same time, each of the arranged electronic components forms an aggregated planar surface on the surface of the substrate, and the whole of the substrate and the electronic components can be formed in a desired planar configuration and size, easily having a mounting surface of one planar surface in the form handled in the same way as normal chip electronic components, so that the handling and mounting the components become easy, and the lowering of the yield due to the mounting error can be settled, and furthermore, along with a high degree of freedom in the arrangement, the mounting in a high density can be handled easily to improve the mounting density as a whole.

According to the mobile device of the present invention, a small-size, light-weight, and cheap mobile device can be obtained with an electronic circuit substrate manufactured by using the characteristics of the above aggregate of the electronic components.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An aggregate of electronic components comprising:
   one substrate having an upper surface and a lower surface;
   at least one upper electronic component provided on the upper surface of the one substrate, said upper electronic component having electrodes that are formed on first side surfaces of the one substrate; and
   at least one lower electronic component provided on the lower surface of the one substrate, said lower electronic component having electrodes that are formed on second side surfaces of the one substrate, wherein the second side surfaces do not have the electrodes of the upper electronic component.

2. An aggregate of electronic components as claimed in claim 1, wherein the upper and lower electronic components are resistors.

* * * * *